US006653214B1

(12) United States Patent
Quach et al.

(10) Patent No.: US 6,653,214 B1
(45) Date of Patent: Nov. 25, 2003

(54) MEASURED VIA-HOLE ETCHING

(75) Inventors: Tony K. Quach, Lebanon, OH (US);
G. David Via, Beavercreek, OH (US);
James S. Sewell, Kettering, OH (US);
Christopher A. Bozada, Beavercreek, OH (US); Gregory C. DeSalvo, Bellbrook, OH (US); Ross W. Dettmer, Dayton, OH (US); John L. Ebel, Beavercreek, OH (US); James K. Gillespie, Cedarville, OH (US);
Thomas Jenkins, Fairborn, OH (US); Kenichi Nakano, Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/034,747

(22) Filed: Jan. 3, 2002

(51) Int. Cl.$^7$ .............................................. H01L 21/44
(52) U.S. Cl. ...................... 438/597; 438/128; 438/598; 438/618; 438/637
(58) Field of Search .................................. 438/128, 129, 438/597, 598, 618, 637; 257/707, 728

(56) References Cited

U.S. PATENT DOCUMENTS

| | | | | |
|---|---|---|---|---|
| 4,951,099 A | * | 8/1990 | Berenz et al. | 257/266 |
| 4,959,705 A | * | 9/1990 | Lemnios et al. | 257/532 |
| 4,970,578 A | * | 11/1990 | Tong et al. | 257/774 |
| 4,974,039 A | * | 11/1990 | Schindler et al. | 257/277 |
| 4,978,420 A | | 12/1990 | Bach | |
| 5,336,930 A | * | 8/1994 | Quach | 257/774 |
| 5,343,071 A | * | 8/1994 | Kazior et al. | 257/621 |
| 5,350,662 A | * | 9/1994 | Chi | 430/313 |
| 5,458,520 A | | 10/1995 | DeMercurio et al. | |
| 5,847,466 A | | 12/1998 | Ito et al. | |
| RE36,773 E | | 7/2000 | Nomi et al. | |
| 6,265,315 B1 | | 7/2001 | Lee et al. | |
| 6,266,874 B1 | | 7/2001 | DiStefano et al. | |
| 6,270,904 B1 | | 8/2001 | Tose et al. | |
| 6,278,189 B1 | | 8/2001 | Jeng et al. | |
| 6,475,889 B1 | * | 11/2002 | Ring | 438/571 |

OTHER PUBLICATIONS

R. Williams, *Modern GaAs Processing Methods*, Artech House, Inc. 1990.
R. Goyal, *Monolithic Microwave Integrated Circuits: Technology & Design*, Artech House, Inc. 1989.

* cited by examiner

*Primary Examiner*—Amir Zarabian
*Assistant Examiner*—Maria Guerrero
(74) *Attorney, Agent, or Firm*—Gerald B. Hollins; Thomas L. Kundert (57) ABSTRACT

An integrated circuit substrate via-hole fabrication arrangement providing for accurate determination of via-hole size and via-hole registration through use of a calibrated pattern formed into the integrated circuit substrate during portions of the normal circuit fabrication process. Initiation of the via-hole and fabrication of the calibrated pattern from one surface, such as the front side, of the integrated circuit wafer and completion of the via-hole from the opposite surface of the wafer are contemplated. The calibrated pattern may be one of several possible physical configurations and of selected dimensions usable with the process, materials and circuitry of the device being fabricated. Use of the invention in fabricating ground conductor-connected via conductors for gigahertz radio frequency-capable integrated circuits of the monolithic or mixed hybrid with monolithic type and having a ground plane element is contemplated.

22 Claims, 8 Drawing Sheets

FIG. 4A Coat wafer with photoresist

FIG. 4B Expose and develop resist

FIG. 4C Deposit gate metal

FIG. 4D Lift-off excess metal and remove resist

FIG. 4E

FIG. 5A — Coat wafer with photoresist

FIG. 5B — Expose and develop resist

FIG. 5C — Deposit bridge metal

FIG. 5D — Lift-off excess metal and remove resist

MEASURED VIA-HOLE ETCHING

CROSS REFERENCE TO RELATED PATENT DOCUMENTS

The present document is somewhat related to the copending and commonly assigned patent application document "STIFFENED BACKSIDE FABRICATION FOR MICROWAVE RADIO FREQUENCY WAFERS", Ser. No. 10/034,723 filed of even date herewith. The contents of this related even filing date application are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

In fabricating Monolithic Microwave Integrated Circuit (MMIC) devices and other integrated circuit devices of the type capable of processing large signals in the radio frequency range above 1 gigahertz for example, the presence of uncontrolled small electrical resistances and inductances (i.e., generically speaking "impedances") in random and unexpected portions of a circuit can have a profound effect on circuit operation. As the frequency of operation increases up to and above 100 gigahertz the parasitic resistances and inductances have increasing impact on circuit performance. Such uncontrolled impedances may, however, easily arise with the use of via-hole structures for connecting upper and lower surfaces of the integrated circuit wafer on which a circuit is fabricated. The presence of such uncontrolled impedances in a particularly critical location of an amplifier circuit may, for example, determine whether the amplifier behaves as the intended signal amplifier or as a signal source, i.e., as an oscillator. The reverse condition is also true with a circuit intended to perform as an oscillator performing instead as an amplifier as a result of via-hole dimensional changes. A particularly difficult aspect of this behavior arises from the fact that such circuit performance changes may occur randomly over a group of fabricated integrated circuit devices without apparent cause until a significant amount of investigation discloses the presence of critical impedance variations relating to physical size tolerances in via-hole conductor elements. Variations in amplifier gain, amplifier phase shift characteristics, transmission line standing wave ratio and other performance changes may arise from via-hole conductor element tolerances that are manifest as slightly differing physical sizes and slightly altered electrical parameter magnitudes.

The frequent radio frequency circuit practice of operating the emitter terminal of a bipolar junction transistor or the source terminal of a field effect transistor in a grounded electrical potential condition contributes perhaps significantly to the via-hole tolerance difficulty since such transistor grounding is often accomplished by way of a via-hole-embodied conductor traversing the thickness of a wafer or a substrate to make connection with the ground plane element disposed over the backside of the radio frequency integrated circuit device. Such ground plane elements although desirable from a transmission line characteristics viewpoint also support the need for via-hole conductors and thus foster the introduction of an added integrated circuit fabrication variable into circuit performance.

The practice of wafer thinning as is often used in Microwave Monolithic Integrated Circuits (MMIC) and other integrated circuit arrangements is useful for obtaining more desirable transmission line characteristics, for heat conduction enhancement and for limiting the length of via-hole conductors for example. Thinning of a substrate from a thickness of about 625 micrometers ($\mu$m) to a thickness of about 100 $\mu$m or to as thin as 25 $\mu$m may be practiced in the radio frequency integrated circuit art. Additional details concerning the practice of wafer thinning are disclosed in the above-identified companion and incorporated by reference herein patent application. The use of wafer thinning although helpful in limiting via-hole conductor length dimensions is also a source of increased via-hole diameter tolerance difficulties because wafers which have been thinned also tend to have greater thickness variations. Such thickness variations can relate directly to via-hole diameter changes and thereby give rise to the circuit performance variations desirably minimized herein. These via-hole diameter variations arise when via-holes are fabricated through use of the usual timed etching process i.e., when an unusually thin wafer location is etched-through more quickly than other portions of the wafer during the allowed etching time and the etching reagent is thus provided with a greater duration of hole-enlargement time at the completion of its vertical etch travel in the thin wafer location than in the normal or thicker wafer locations.

Since a significant part of the advantages offered by realization of electronic apparatus with integrated circuit devices arises from the short lead lengths and the relatively precise repeatability of component characteristics in the integrated circuit fabrication process, the introduction of a significant "new" variables element as described in these paragraphs is particularly unwelcome-especially in devices operating in the high radio frequency range from microwave upward. The present invention provides control of the via-hole conductor size and impedance variables, an arrangement implementable without new or additional wafer processing steps and thus with desirable low overhead cost. The present invention provides an etching assistance tool that may be used to overcome or limit the effect of these via-hole dimension and electrical characteristics variations.

The present invention provides an arrangement for controlling this via conductor impedance variable through controlling the achieved dimensions of a substrate via-hole. The invention provides an etching vernier pattern that can be placed in the via-hole to allow ex-situ monitoring of the via-hole formation etching process and thus determine the size of the subsequent via conductor. Furthermore, the achieved etching vernier also provide a measure of via-hole diameter variation across a substrate.

SUMMARY OF THE INVENTION

The present invention provides an arrangement for controlling the variation in electrical impedance presented by a small diameter via-hole and a larger via-hole through controlling the achieved dimensions of a via-hole. The invention provides an etching vernier disposable in the via-hole to allow precise monitoring of the via-hole etching process. Furthermore, the achieved etching vernier will also provide a measure of the via-hole diameter variation across a given substrate. Such via-hole dimensional change data may also be a useful tool for process development and control through a statistical process control (SPC) methodology.

It is therefore an object of the invention to provide an integrated circuit wafer etching vernier pattern.

It is another object of the invention to provide a via-hole measurement arrangement that is usable during via-hole etching.

It is another object of the invention to provide an etched cavity measurement pattern of particularly useful physical configuration.

It is another object of the invention to provide an etching vernier capable of identifying a properly etched via-hole condition in a substrate.

It is another object of the invention to provide an etching vernier capable of identifying both an over etched and an under etched via-hole condition in a substrate.

It is another object of the invention to provide an etch measurement pattern having precise physical measurement standards included therein.

It is another object of the invention to provide an integrated circuit wafer etching vernier pattern usable to indicate wafer thickness variations.

It is another object of the invention to provide an etching vernier that is useful in identifying a wafer etching mask misalignment condition.

It is another object of the invention to provide an etching vernier capable of providing etch progression information near the end of an etching event when such information is particularly useful.

It is another object of the invention to provide a metallic pattern etching vernier for an integrated circuit wafer.

It is another object of the invention to provide an integrated circuit etching vernier metallic pattern that is compatible with normal wafer processing and requiring of no additional integrated circuit device processing steps for realization.

It is another object of the invention to provide a via-hole measurement tool useful for process development and process control through statistic process control (SPC) methodology.

It is another object of the invention to provide a partially completed radio frequency integrated circuit apparatus inclusive of a recessed metallic via-hole measurement element.

These and other objects of the invention will become apparent as the description of the representative embodiments proceeds.

These and other objects of the invention are achieved by partially completed radio frequency integrated circuit apparatus comprising the combination of:

- an integrated circuit substrate member having a plurality of electrical components and electrical conductors disposed on an upper surface thereof and having a selectively shaped via-hole precursor recess extending a selected distance from said upper surface into a substrate thickness portion;
- a layer of metal covering a bottom surface portion of said selectively shaped via-hole precursor recess at said selected distance from said upper surface within said substrate thickness portion, said bottom surface portion metal being of said selectively shaped via-hole physical configuration;
- a via-hole etch recess disposed in lateral registration with said shaped via-hole precursor recess and extending from a back surface of said substrate into said substrate thickness portion toward said bottom surface portion metal of said selectively shaped via-hole physical configuration.

BRIEF DESCRIPTION OF THE DRAWING

The accompanying drawings incorporated in and forming a part of the specification, illustrate several aspects of the present invention and together with the description serve to explain the principles of the invention. In the drawings.

DETAILED DESCRIPTION OF THE INVENTION

Figure 1:
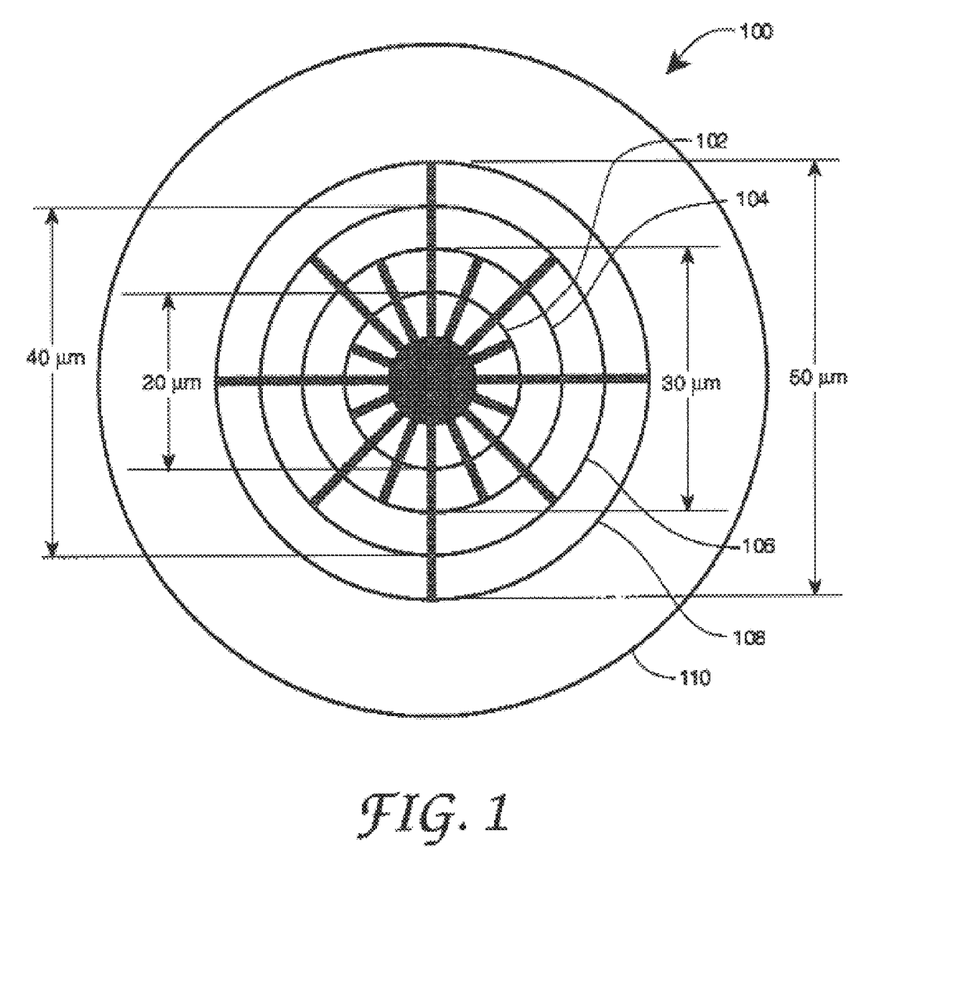
FIG. 1 shows one arrangement of an etching vernier according to the present invention.

The vernier marker or etching vernier of the present invention can be embodied in differing physical patterns in order to indicate the accomplishment of a desired degree of etching within a substrate via-hole. Each of these possible physical patterns includes both a specifically configured physical shape and a measurement scale embodied in the form of different element lengths or different arm lengths or different leg lengths in this specifically configured physical shape. FIG. 1 in the drawings shows one of these possible patterns 100, as it is disposed to provide the four differing length measurement scales of 20 micrometers, 30 micrometers, 40 micrometers and 50 micrometers for a via-hole of an integrated circuit device. Another way of referring to the element lengths shown in the FIG. 1 pattern is to consider the radial length of each element, i.e., the lengths of 10 micrometers, 15 micrometers, 20 micrometers and 25 micrometers. For drawing convenience purposes the respective element lengths of the FIG. 1 pattern are enclosed by the four differing diameter circles shown at 102, 104, 106 and 108 however it is contemplated that during use of the FIG. 1 pattern these circles are omitted and only the geometric pattern of different element lengths appear in the via-hole of a substrate being processed. The FIG. 1 four differing length measurement scales of 20 micrometers, 30 micrometers, 40 micrometers and 50 micrometers for an etching vernier are found to be suitable for use with via-holes that are normally of 40 micrometers diameter; these lengths can be adjusted to larger or smaller values as may be desirable for other nominal via-hole diameters. For convenience the FIG. 1 pattern may be referred-to as an asterisk-like pattern, i.e., as including an "asterisk" of unequal arm or leg lengths.

The manner in which the FIG. 1 etching vernier and the other etching verniers disclosed herein are disposed in a via-hole is an interesting aspect of the present invention. Generally this disposition may be accomplished during steps otherwise used to fabricate the transistors and associated components included in the-integrated circuit device containing the via-hole measured by the FIG. 1 pattern. Such fabrication of the FIG. 1 etching vernier in fact need not include additional fabrication steps devoted to realization of the etching vernier. Generally according to the preferred arrangement of the invention the FIG. 1 etching vernier pattern is embodied in the form of a metallic pattern of etching-tolerant metal and is located within the thickness of the electrically-insulating substrate or semiconductor material of the device being fabricated.

How the Pattern is Made

FIG. 2 in the drawings includes the five views of FIG. 2A, FIG. 2B, FIG. 2C, FIG. 2D and FIG. 2E. The first four of these views relate to side or cross sectional representations of the fabrication sequence for a second arrangement of the etching vernier, a vernier having the pattern shown in the FIG. 2E top view drawing. The arm or leg lengths of the FIG. 2E pattern may, for example, be 30, 40 and 50 micrometers; the FIG. 2E pattern may also be referred-to as a multiple cross pattern. Notably the FIG. 2E drawing is drawn to a differing smaller scale than the FIG. 2A–FIG. 2D drawings as will become apparent in the discussion below.

The first step in fabricating the FIG. 2 etching vernier is to define the vernier pattern on the front side of the substrate using a photolithography process. The process flow is as follows.

Figure 2A:
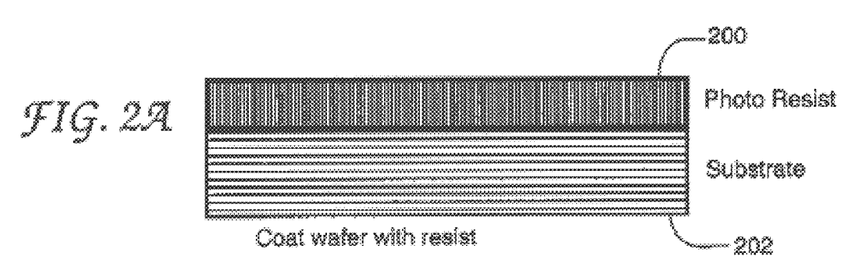
FIG. 2A shows a first step in the fabrication of a second pattern etching vernier according to the present invention.

Step 1.) Etching vernier pattern formation: Vernier patterns can be fabricated during the alignment marker step of the integrated circuit fabrication sequence. This process step consists of depositing a layer of photoresist 200 on the substrate 202 as shown in FIG. 2A. Then vernier patterns are defined by exposing and developing the photoresist to form etching vernier openings as shown at 204 in FIG. 2B. Next, openings in the photoresist are etched to about 0.2–1 micrometer depth into the substrate 202 as shown at 206 in FIG. 2C. This etched depth is the "critical thickness" for the via-hole etching process. The etchant used for this step depends of course on the type of material used in the substrate 202 and may be for example one of a citric acid and water, a Hydrofluoric acid and water, a hydrochloric acid and water, or a sulfuric acid and water combination when the substrate 202 is gallium arsenide semiconductor material. The final step in the FIG. 2 sequence is to remove the photoresist using, for example, a solvent such as acetone as is represented in FIG. 2D.

Figure 2B:
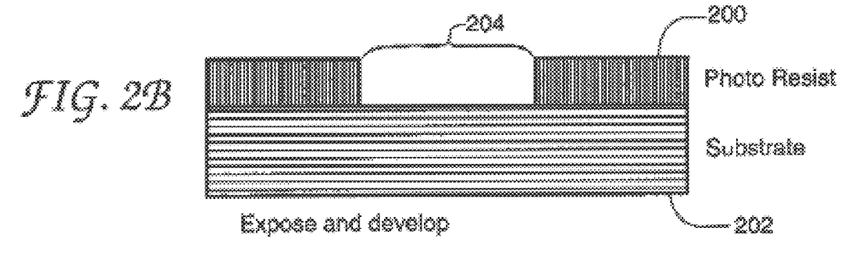
FIG. 2B shows a second step in the fabrication of a second etching vernier according to the present invention including a vernier opening.
Figure 2C:
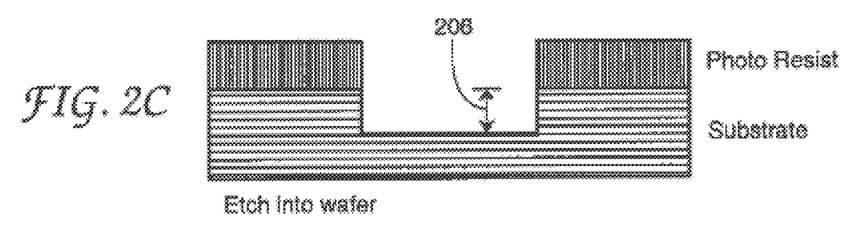
FIG. 2C shows a third step in the fabrication of a second etching vernier according to the present invention.
Figure 2D:
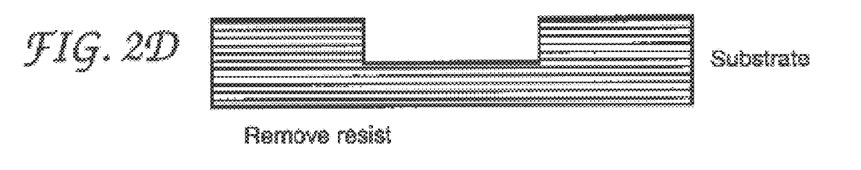
FIG. 2D shows a fourth step in the fabrication of a second etching vernier according to the present invention.
Figure 2E:
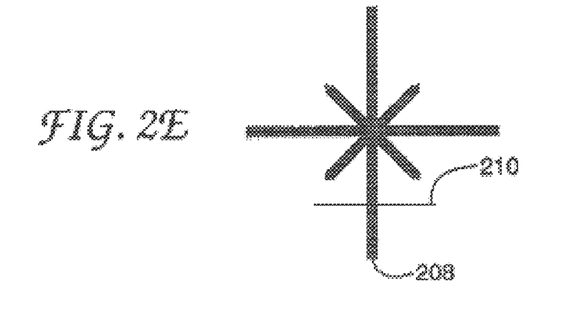
FIG. 2E shows a top view of the second etching vernier according to the present invention including alternate representation of the FIG. 2B opening.

The etching vernier opening shown at 204 in FIG. 2B may be considered to represent the portion of the FIG. 2E pattern shown at 208 i.e., to represent a cross section taken along the line 210 in FIG. 2E for example. The differing widths of the same 204/208 feature in FIG. 2C and FIG. 2E result from the above mentioned differing scales for these two drawings. The term "critical thickness" is used with respect to the dimension 206 in the FIG. 2C view of FIG. 2 in view of the fact that the FIG. 2E pattern is placed throughout a gallium arsenide substrate at a precise lateral and depth location where via-holes are being disposed—usually at source and emitter contact regions of field effect transistor and bipolar junction transistor types respectively.

Step 2.) Etching vernier formation: Typical transistor device fabrication in an integrated circuit requires an Ohmic metallization process step to form the Source/Drain terminals of a Field Effect Transistor (FET) or the Collector terminal for a Bipolar Junction Transistor (BJT). This same process step may be used to form present invention etching vernier in the substrate. Thus Ohmic metallization such as the Nickel/Germanium/Gold metal system with a metal thickness of 0.4 micrometer or larger can, in the instance of a gallium arsenide transistor device, also be inclusive of the present invention. One may also use the present invention in a Titanium/Gold ohmic metallization system in instances when the device structure includes an InGaAs ohmic layer of the type disclosed for example in our previously issued U.S. Pat. Nos. 5,698,870; 5,698,900; 5,796,131; 5,869,364; 5,940,694 and 5,976,920 concerning a "SLIMFET". The contents of these previously issued U.S. Patents is hereby incorporated by reference herein. Fabrication of the present invention during such ohmic metallization process steps is of course a convenience option rather than a limitation of the invention.

Figure 3A:
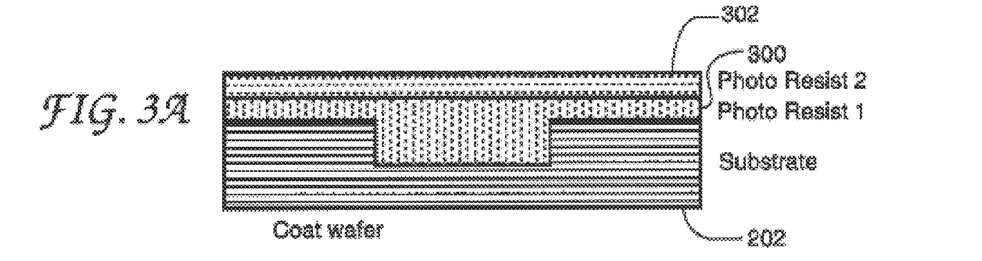
FIG. 3A shows a first step in the fabrication of an ohmic contact and etching vernier according to the present invention.
Figure 3B:
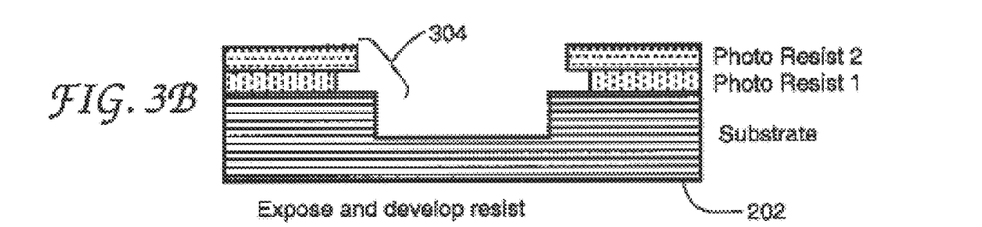
FIG. 3B shows a second step in the fabrication of an ohmic contact and etching vernier according to the present invention.
Figure 3C:
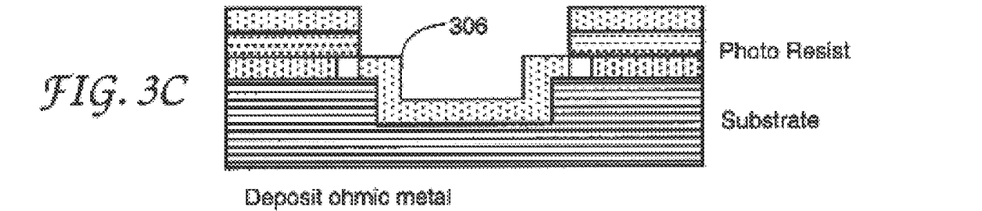
FIG. 3C shows a third step in the fabrication of an ohmic contact and etching vernier according to the present invention.
Figure 3D:
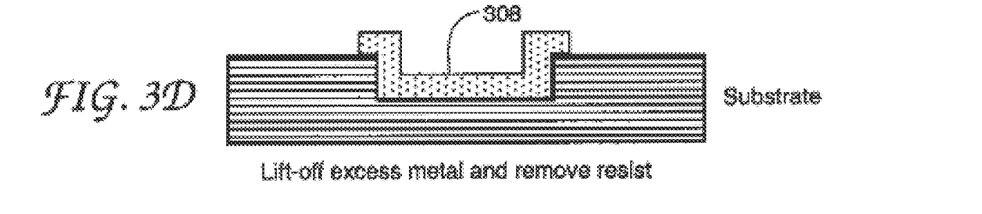
FIG. 3D shows a fourth step in the fabrication of an ohmic contact and etching vernier according to the present invention.
Figure 3E:
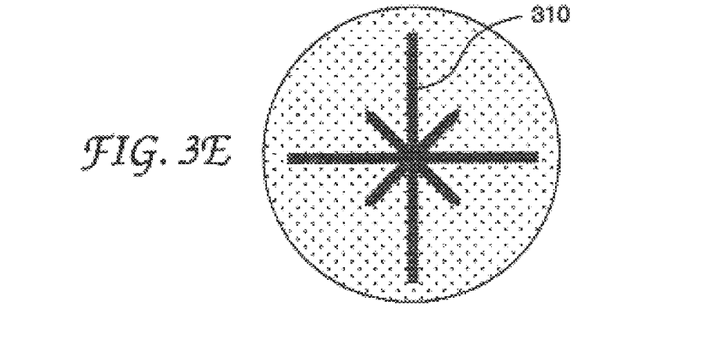
FIG. 3E shows a top view of a metallized etching vernier according to the present invention.

To form the actual metallic etching vernier the selected pattern is redefined using a second photolithography process. This second process utilizes two layers of photoresist as shown at 300 and 302 in FIG. 3A. A significant aspect of this process is to make the metal pattern slightly larger than the etched vernier pattern as is represented by the recessed metal receptacle photoresist cross sections shown at 304 in FIG. 3B. This recess arrangement ensures complete coverage of the etched pattern, and thereby allows for via-hole misalignments. The actual etching vernier is formed by evaporating Ohmic metal into the photoresist opening as shown at 306 in FIG. 3C. The last activity is to remove unwanted metal and the photoresist layers 302 and 300 by a lift-off operation as shown in FIG. 3D. FIG. 3E shows a top view of the metallized vernier pattern formed in the FIG. 3 sequence. The metal represented at 310 in FIG. 3E is the metal shown at 308 in FIG. 3D using a different scale.

It is significant to realize that through this FIG. 3 step 2 of the present invention process we have achieved a pattern of specific configuration, including dimensioned arm or leg elements, that is to be permanently imparted at a specific depth within the substrate of the integrated circuit device being fabricated. The peripheral footprint of this pattern is in fact the shape of the opening in the photoresist that is defined in the FIG. 2 step 2 and this shape is not changed in the succeeding process steps.

Figure 4A:
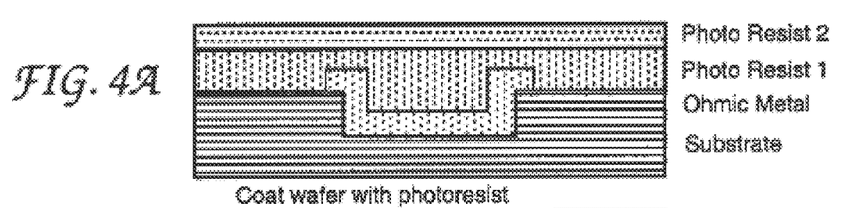
FIG. 4A shows a first step in the fabrication of a gate contact and etching vernier according to the present invention.
Figure 4B:
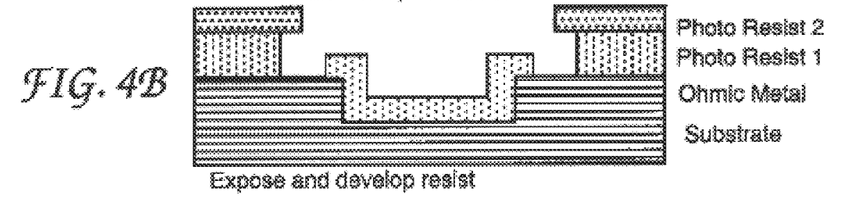
FIG. 4B shows a second step in the fabrication of a gate contact and etching vernier according to the present invention.
Figure 4C:
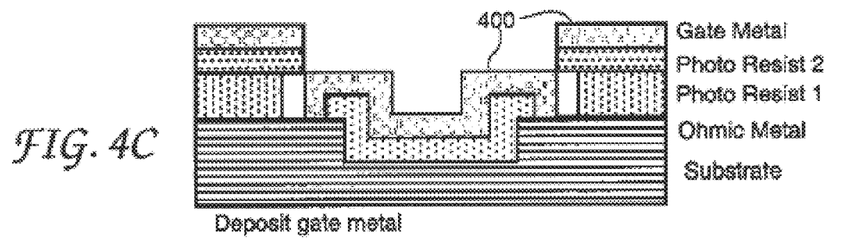
FIG. 4C shows a third step in the fabrication of a gate contact and etching vernier according to the present invention.
Figure 4D:
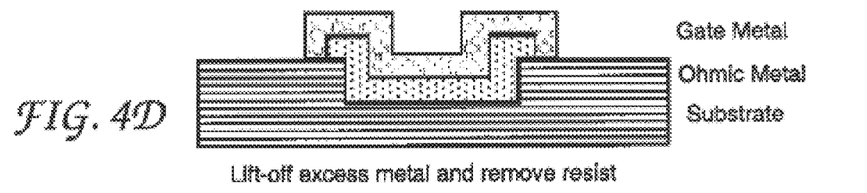
FIG. 4D shows a fourth step in the fabrication of a gate contact and etching vernier according to the present invention.
Figure 4E:
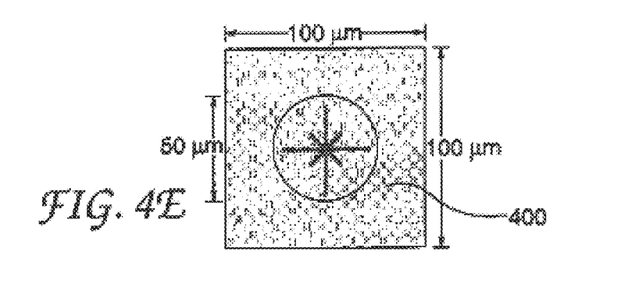
FIG. 4E shows a top view of a twice metallized etching vernier according to the present invention.

Step 3.) Pad metal for via-holes: Pad metals for the via-holes may be deposited on the substrate top surface during the gate process for field effect transistors or the sub-collector process and the subsequent bridge metallization for bipolar junction transistors. The process flow for the pad metal sequence is similar to that of the above Step 2 in that two layers of photoresist are employed to facilitate use of a metal lift-off operation and the metal pattern of each subsequent step is larger than the previous metal pattern. The overall Step 3 process is illustrated in FIGS. 4A–4D for the first pad and FIGS. 5A–5D for the second pad. A second layer of "bridge metal" is added in the FIG. 5 sequence. As suggested by the term "bridge metal" this metal is used to form cross-overs or bridges for device and circuit components. Removal of the excess metal and photoresist layers is accomplished in the FIG. 4D and FIG. 5D drawings using a lift-off and acetone solvent sequence. The metal added in the FIG. 4 sequence is indicated at 400 in the FIG. 4C and FIG. 4E drawings. Representative dimensions are included in the FIG. 4E drawing however, as these dimensions suggest, the drawing scales again differ between FIG. 4D and FIG. 4E.

Figure 5A:
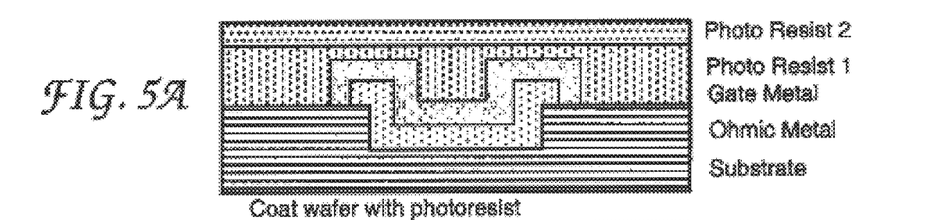
FIG. 5A shows a first step in the fabrication of a bridge metal layer and etching vernier according to the present invention.
Figure 5B:
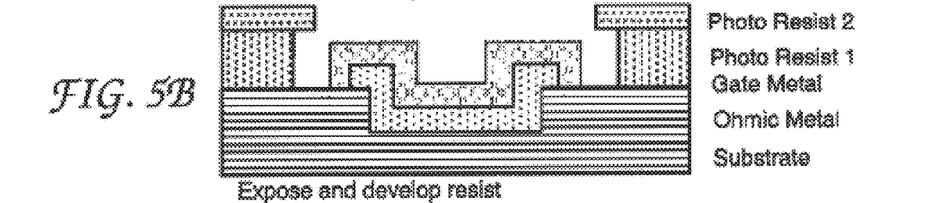
FIG. 5B shows a second step in the fabrication of a bridge metal layer and etching vernier according to the present invention.
Figure 5C:
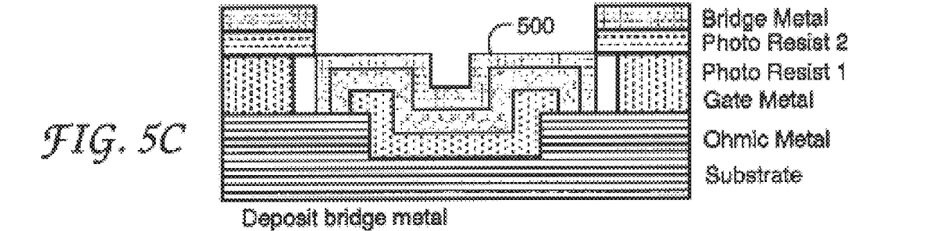
FIG. 5C shows a third step in the fabrication of a bridge metal layer and etching vernier according to the present invention.
Figure 5D:
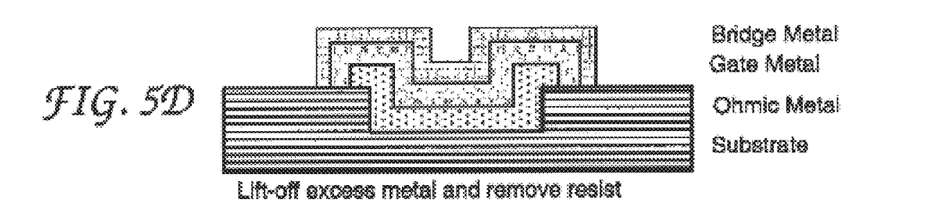
FIG. 5D shows a fourth step in the fabrication of a bridge metal layer and etching vernier according to the present invention.
Figure 5E:
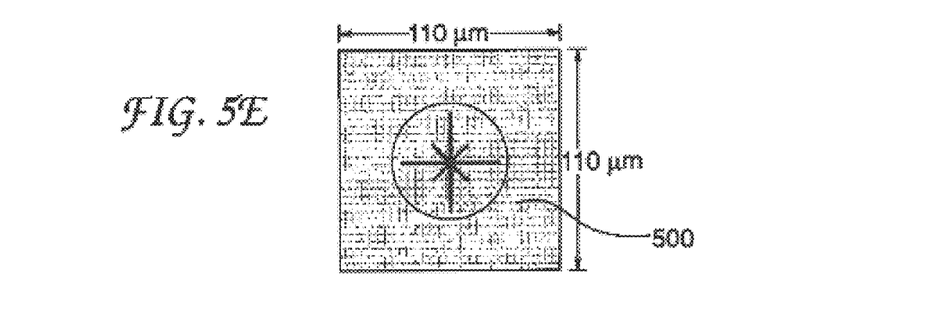
FIG. 5E shows a top view of a thrice metallized etching vernier according to the present invention.

The additional metal added in the FIG. 5 sequence is identified by the pattern indicated at 500 in the FIG. 5C and FIG. 5E drawings. Representative dimensions are also included in the FIG. 5E drawing. The dimensions shown in FIG. 5E are slightly larger than those shown in FIG. 4E indicating the overlapping nature of the metal 500 shown in FIG. 5C and FIG. 5D.

The steps 1–3 above and the FIGS. 2–5 drawings describe the front side processing steps to form etching vernier that will be used as a guide during a substrate back side via-hole etching sequence. Fabrication of the vernier patterns is compatible with the MMIC process for radio frequency integrated circuits so no additional processing events are required. The above-disclosed metal system and other possible metal systems for making the verniers and pads are impervious to the backside etchants. Thus the front side metal acts as a barrier which enables selective backside etching when using either an RIE dry etch process or an alternate wet chemical etch process to form via-holes.

Once the front side process is completed, the vernier pattern is established and is ready for backside processing. The backside process may consist of mounting the wafer on a carrier (of sapphire using wax for examples) with the circuit side down and then thinning the substrate to a desired thickness (of, for example, 25 to 100 micrometers). Then via-hole patterns are defined in registration with the front side elements from the substrate backside. This definition may use another photoresist procedure as is represented in the FIGS. 6A–6F drawings. The backside etching may use either a reactive ion etching (RIE) or a wet chemical etching processes the results of which are represented in the FIG. 6C drawing. FIG. 6E again shows a top view or front side view of the etching vernier, a view substantially unchanged from that of the FIG. 5E drawing. The metal layer shown at 604 in FIG. 6 is representative of the ground plane metal usually present in a radio frequency integrated circuit device. This metal is of course placed in connection with selected via-hole metallization in the completed device.

Figure 6A:
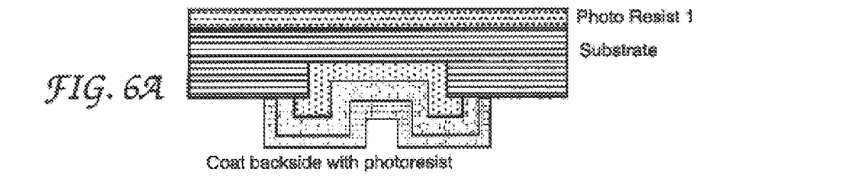
FIG. 6A shows a first step in the fabrication of a substrate backside via-hole according to the present invention.
Figure 6B:
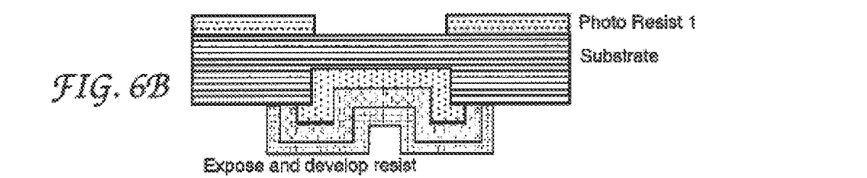
FIG. 6B shows a second step in the fabrication of a substrate backside via-hole according to the present invention.
Figure 6C:
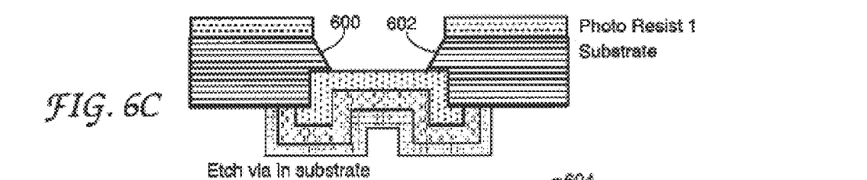
FIG. 6C shows a third step in the fabrication of a substrate backside via-hole according to the present invention.
Figure 6D:
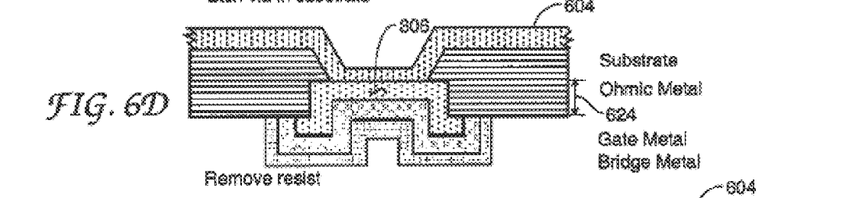
FIG. 6D shows a fourth step in the fabrication of a substrate backside via-hole according to the present invention.
Figure 6E:
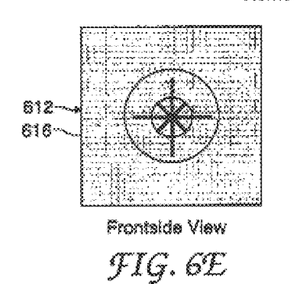
FIG. 6E shows another top view of a thrice metallized etching vernier according to the present invention.
Figure 6F:
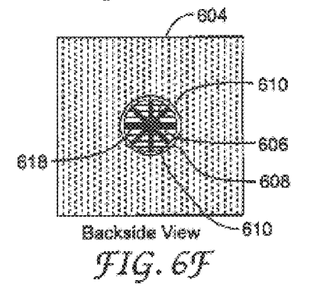
FIG. 6F shows a bottom view of a via-hole and metallized etching vernier according to the present invention.

FIG. 6F in the drawings shows a larger backside or bottom view of the FIG. 6E etching vernier as it would appear under optimally etched via-hole conditions. The backside metal 604 from FIG. 6D appears again at 604 in FIG. 6F; the asterisk pattern from FIG. 2 also shows in the FIG. 6F drawing. In the FIG. 6F bottom view drawing only a central portion of the asterisk pattern appears because the longer arms of the pattern are obscured by the lowermost aperture 606 of the via hole being measured. The sloping sidewalls of the via hole appear at 608 in FIG. 6F and the backside greatest diameter of the via hole is identified by the number 610 in FIG. 6F.

A RIE (reactive ion etch, i.e., dry etch) process is preferred over a wet chemical process for the FIG. 6 sequence due to the anisotropic etching characteristics of the RIE process and the resulting formation of steeper sidewalls with smaller via-holes. Via-holes are etched from the back of the substrate to the front side pads in the FIG. 6 sequence. Observation of the FIG. 6F pattern is preferably accomplished using a microscope while looking into the via-hole. Repeated observations may of course be used as the etching progresses in order to achieve the desired via-hole size with precision.

Figure 6G:
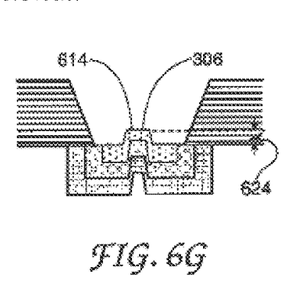
FIG. 6G shows a cross sectional view of a metallized etching vernier according to the present invention.

FIG. 6G in the drawings shows another profile or cross sectional view of the inverted wafer appearing in FIG. 6D. The FIG. 6G drawing provides additional explanation of the FIG. 6 backside etching sequence and is believed of assistance in correlating the etching vernier representations in the FIG. 6D and FIG. 6F drawings. The backside view of the etching vernier appearing in FIG. 6F is actually in the form of a mesa-like structure and is in fact comprised of the ohmic metal appearing at 306 and 308 in the FIG. 3 drawing. In the FIG. 6D drawing this mesa-like metal 306 is relatively wide in appearance with respect to the via hole opening because the FIG. 6D drawing represents a "cut" through the etching vernier pattern taken through its center i.e., taken along the line of arrow 612 in FIG. 6E. In the FIG. 6G drawing the etching vernier metal 306 is much narrower in its mesa appearance at 614 because the FIG. 6G drawing represents a "cut" through the FIG. 6E etching vernier taken along the line of arrow 616 through an arm portion of the etching vernier pattern. Notably the metal 306 in the FIG. 6D drawing would not be visible in a backside view of the FIG. 6D structure because it is covered with backside metal 604. In any event it is the mesa appearing at 614 in FIG. 6G that forms the etching vernier pattern appearing at 618 in the FIG. 6F drawing. The "critical thickness" dimension, i.e., the height of the etching vernier pattern mesa is indicated at 624 in FIG. 6G.

The etching represented in FIG. 6 will first reach the vernier pattern of metal 306 in the via-hole just prior to reaching the front side pad metals 400 and 500. The duration of this vernier pattern to the front side pad metal etching interval is of course dependent on the "critical thickness" dimension depth location of the vernier pattern as is discussed above. Larger thickness dimensions in the recited 0.2–1 micrometer thickness range providing greater interval times. Once the first portion of the vernier pattern is reached, the backside via hole etching process is nearly completed and moreover the vernier pattern can be observed as needed using a microscope. How much more to etch the backside via hole depends on the metal thickness of the vernier pattern which is controlled by the etch depth in step 1 and FIG. 2C and by the thickness of metal layer 306 in FIG. 3C.

In the nearly completed backside via hole etching process each individual etching vernier will clearly show the via-hole opening dimension and thus it is easily discernable which via-holes in a substrate are etched optimally and which via-holes are under-etched (e.g. with observation of only a portion of the 30 micrometer etching vernier) or over-etched (e.g. with observation of the 50 micrometer etching vernier and beyond). Examples appear in the later drawings herein. The sloping portion (i.e., the via-hole side walls) of the substrate within the via-hole, is identified at 600 and 602 in FIG. 6C. This sloping portion borders the region of under-etch or over-etch adjacent the etching vernier. FIG. 6G shows the sidewall sloping portion as it appears in an optimally etched via-hole cross section. With continued etching this sloping portion of the substrate will of course become greater in diameter and result in a via-hole conductor of greater diameter and lower electrical resistance and inductance. If via-holes are under-etched, the parasitic electrical resistance and inductance from the vias may be too large; this can have an adverse effect on circuit performance. If the via-holes are over-etched, the connecting pad on the circuit side of the substrate may be shorted to other terminals or transmission lines of the circuit being fabricated and of course smaller values of parasitic electrical resistance and inductance are obtained.

Preferably, a wet chemical etch step is performed following the FIG. 6 reactive ion etching. The purpose of this wet etch is to refine the via-hole profile and make it most suitable for metallization. However, this wet etch may aggravate any over-etching problem that may have occurred during the reactive ion etching and therefore needs to be considered in performing the reactive ion etching sequence. The etching vernier of the present invention also can be used to monitor this additional wet etch step. Notably if such a wet chemical etch process is used instead of the entire preferred RIE process to fabricate vias, then the etching vernier of the present invention plays an even more critical role in controlling the etching process because substrate thickness variations have been found to have a greater effect on the wet chemical etching process than on the RIE process.

As a further consideration with respect to substrate thickness variations, it is a notable attribute of the present invention that the disclosed etching vernier provides useful information regarding substrate thickness variations present i.e., the variations occurring especially in a thinned substrate are made known. In view of a substantially constant etch rate to be expected in via-holes located across the surface of a substrate it follows that a via-hole etch disposed in a relatively thin portion of such a substrate will attain any specific state of FIG. 6C etching prior to another via-hole that is disposed in a thicker part of the substrate. In fact a region of such fast completing via-hole etches is to be expected where a thin substrate region exists (and is visible where the number of via-holes being etched in the substrate is sufficient in density and location to make a regional pattern of fast progression discernable). Such a regional pattern of fast completing via-hole etches may of course be readily detected with microscope observation of several sample via-holes and their included etching vernier after the etching has progresses to a state resembling that of FIG. 6F or FIG. 6G. Once thusly detected, corrective action in the form of a more localized continued etch can be employed to achieve a desired via-hole array etch or individual substrates having serious thickness variations can be excluded.

Figure 7:
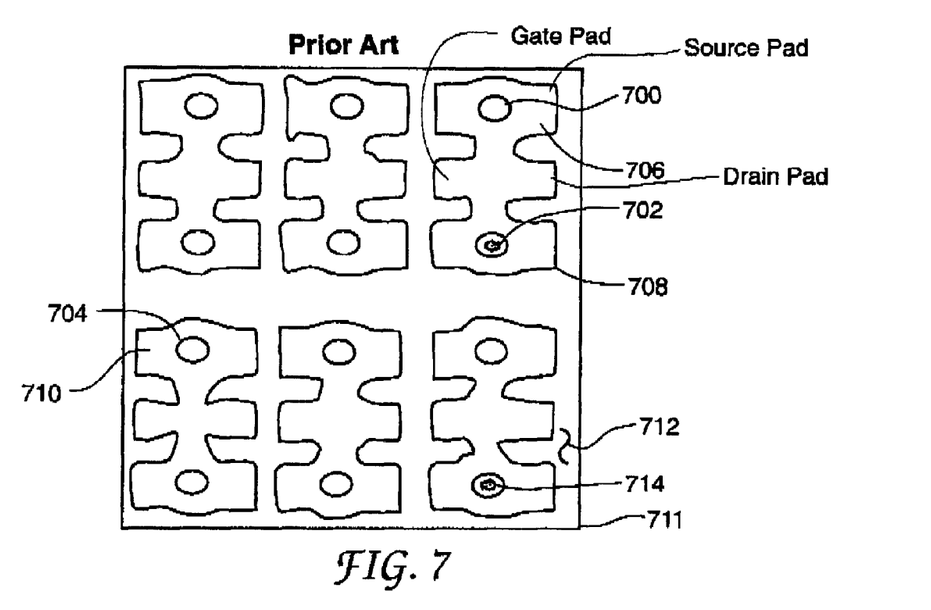
FIG. 7 shows a typical prior art landing pad and via-hole array in an integrated circuit device.

FIG. 7 in the drawings shows a drawing reproduction of a microphotograph providing background details relating to several aspects of the present invention. In the FIG. 7 drawing a typical array of via-holes 700, 702 and 704 with associated landing pads 706, 708 and 710 are shown to be disposed across the top surface 712 of a substrate 711. Of particular interest in the FIG. 7 drawing are the dark spots 714 located in the center portion of several via-holes. These dark spots in fact represent substrate material remaining present on the accessed metal and are accompanied by an incomplete etching of the surrounding via-hole. Such remainder substrate material is easily avoided in a via-hole etching accomplished according to the present invention. Also visible in the FIG. 7 drawing is a distinctly oval shape in certain of the via-holes, such as the via-hole at 704. This oval shape may in fact be the result of a substrate thickness variation occurring along the horizontal and vertical axes of the via-hole 704 or may also result from over etching of the via hole. Observation of the via-hole etching with the aid of an etching vernier of the herein disclosed and other patterns may be used to identify or preclude the occurrence of such oval or other undesired perturbations in via-hole shape. One such application of the present invention can for example involve setting a tolerance limit for acceptance of such oval or perturbated via-holes in a substrate and measuring, with respect to this limit, using the present invention etching vernier.

Figure 8:
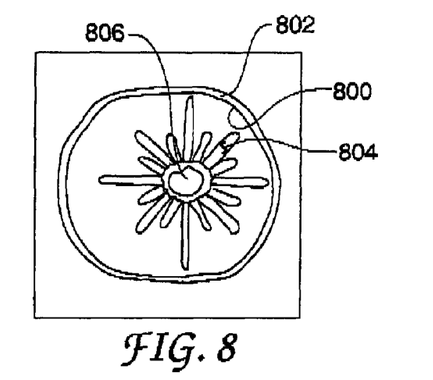
FIG. 8 shows an etching vernier according to the present invention in an offset via-hole.

FIG. 8 in the drawings shows another use of an etching vernier according to the present invention. In the FIG. 8 drawing an etching vernier 804 of the FIG. 1 pattern is shown in a drawing-reproduced microphotograph of an etched via-hole 800 that is displaced from its desired centered-on-pattern location by a mask misalignment problem. In the FIG. 8 drawing this misalignment may be observed to be of about 20 micrometers extent with the via hole 800 being displaced to the left and also slightly downward from its intended location. The measurement scale-included aspect of the present invention makes correction of the mask alignment difficulty in FIG. 8 relatively simple in succeeding devices. In the FIG. 8 drawing the via hole sidewall is identified at 802 and an extraneous shadow or possible residue mass appears at 806.

Figure 9:
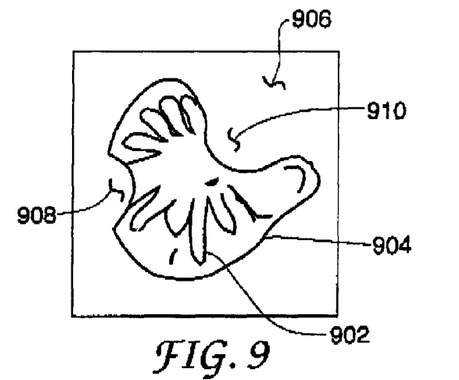
FIG. 9 shows an etching vernier according to the present invention in an under-etched via-hole.

FIG. 9 in the drawings shows another application of an etching vernier according to the present invention. In the FIG. 9 drawing an etching vernier 902 also of the FIG. 1 pattern is shown in a drawing-reproduced microphotograph of an etched via-hole 904 that is under-etched and in need of additional etching time for completion. Undesired remainder portions of the substrate 906 appear at 908 and 910 in the FIG. 9 drawing. The measurement scale of the present invention pattern is again useful in estimating the additional etching time needed for the FIG. 9 via-hole 904.

Figure 10:
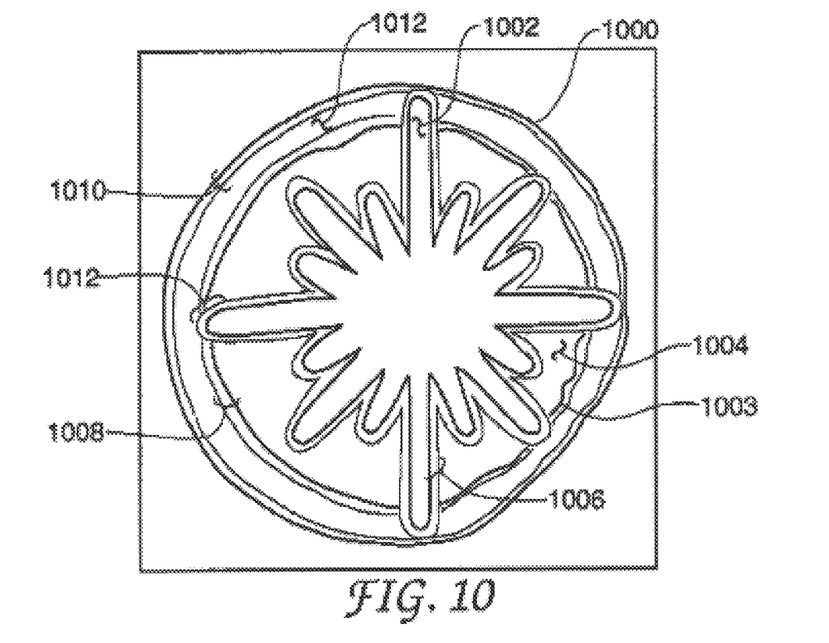
FIG. 10 shows an etching vernier according to the present invention in a properly etched via-hole.

FIG. 10 in the drawings shows a via-hole that is properly etched and of about 50 micrometer diameter as measured by a FIG. 1 type of etching vernier pattern 1002. The microscope used in making the FIG. 10 microphotograph drawing is focused on the surface 1004 of the substrate material within the via hole 1003. This focusing on the lowest level surface in FIG. 10 causes the other higher level objects in the microphotograph and the FIG. 10 drawing to appear in an unfocused or blurred condition as the draftsperson has faithfully represented by the double lines appearing at 1006, 1008 and 1010 for example in the FIG. 10 drawing. The via hole sloping sidewall surface appears at 1012 in FIG. 10. It is interesting to note in the FIG. 10 drawing that in the region 1012, for example, the mesa of the etching vernier appears to interrupt the lowermost or smallest diameter of the via hole; this follows from the fact that the backside etching reaches the higher surface of the etching vernier mesa prior to reaching the surface 1004 and therefore the etching vernier portions rise above the intersection of the etching vernier arms with the smallest diameter of the etching vernier.

Figure 11:
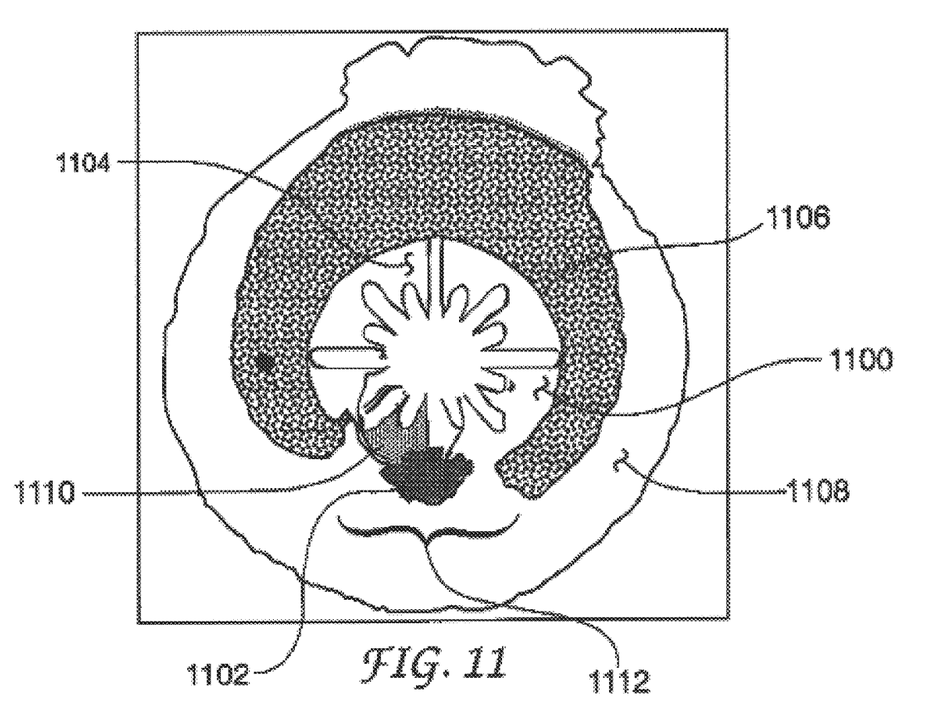
FIG. 11 shows an etching vernier according to the present invention in an over-etched via-hole.

A partially over etched via-hole is represented in the FIG. 11 microphotograph; note particularly the larger than desired 50 micrometer side to side diameter of the via hole 1106 and the corresponding longer radius of the via hole in the region 1104. The substrate surface 1100 is exposed by the via hole 1106 in the FIG. 11 drawing. The via hole sidewall appears at 1108. The FIG. 11 irregular shaped objects at 1102 and 1110 for example represent etching residue remainders. The etching vernier of the present invention also makes an uneven etching condition easy to discern in the FIG. 11 drawing; the lowermost portion of the via hole 1112 is clearly etched to lesser degree than is the upper portion of the via hole in the region at 1104.

The present invention therefore provides a guide that enables precise via-hole etching in an integrated circuit substrate. The invention can thus be perceived as providing a new method of fabricating integrated circuit devices. The invention is seen to be especially useful in placing ultra-small via-holes within a small pad that is comparable in size to the device feature. An example is to place via-holes within the source pads of multiple finger FET devices. As the frequency of device operation increases, the size of the device and circuit will decrease proportionately. The present invention can thus play a significant role in device applications requiring circuit operation beyond 1 GHz. and other small geometry devices.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the-invention in various embodiments and with various modifications as are suited to the particular scope of the invention as determined by the appended claims when interpreted in accordance with the breadth to which they are fairly, legally and equitably entitled.

We claim:

1. The method of constructing a ground plane-inclusive radio frequency Monolithic Microwave Integrated Circuit on a wafer of semiconductor material, said method comprising the steps of:

fabricating a plurality of circuit elements of said radio frequency Monolithic Microwave Integrated Circuit, including transistor component elements, on a front side surface of said wafer of semiconductor material;

said fabricating including forming via-hole recessions of selected shape having salient arm portions of graduated arm lengths each comparable with a selected finished diameter of via-holes in said semiconductor wafer and of selected depth into said semiconductor wafer front side surface;

metallizing said front side circuit elements of said radio frequency Monolithic Microwave Integrated Circuit including said transistor component elements;

said metallizing step also including wafer front side depositing of metal at said selected depth in said selected shape via-hole recessions;

etching, from a backside surface of said wafer, remaining depth portions of each said via-hole recession into said semiconductor wafer;

terminating said etching step in response to said backside etching exposing selected portions of said selected shape via-hole recession deposited metal; and covering said wafer backside surface and said exposed selected portions of said selected shape via-hole recession-deposited metal with ground plane-forming metallization.

2. The method of constructing a ground plane-inclusive radio frequency Monolithic Microwave Integrated Circuit on a wafer of semiconductor material of claim 1 wherein said step of terminating said etching step in response to said backside etching exposing selected portions of said selected shape via-hole recession deposited metal also comprises terminating said etching step upon achieving a selected via-hole diameter.

3. The method of constructing a ground plane-inclusive radio frequency Monolithic Microwave Integrated Circuit on a wafer of semiconductor material of claim 1 wherein said step of forming via-hole recessions of selected shape includes forming via-hole recessions having salient arm portions comprising one of a multiple cross and an asterisk patterns and having arm lengths of between ten and twenty-five micrometers.

4. The method of constructing a ground plane-inclusive radio frequency Monolithic Microwave Integrated Circuit on a wafer of semiconductor material of claim 1 wherein said step of fabricating a plurality of circuit elements of said radio frequency Monolithic Microwave Integrated Circuit, including transistor component elements, on a front side surface of said wafer of semiconductor material comprises fabricating one of field effect transistors and bipolar junction transistors on one of a gallium arsenide wafer and a another periodic table Group III–V semiconductor material wafer.

5. The method of constructing a ground plane-inclusive radio frequency Monolithic Microwave Integrated Circuit on a wafer of semiconductor material of claim 1 wherein said step of metallizing said front side circuit elements of said radio frequency Monolithic Microwave Integrated Circuit including said transistor component elements and said included step of front side depositing of metal at said selected depth in said selected shape via-hole recessions also comprises a step of metallizing one of transistor gate, source, drain, emitter, base and collector elements in said integrated circuit.

6. The method of constructing a ground plane-inclusive radio frequency Monolithic Microwave Integrated Circuit on a wafer of semiconductor material of claim 1 wherein said step of terminating said etching step in response to said backside etching exposing selected portions of said selected shape via-hole recession deposited metal comprises terminating said etching step in response to achieving a selected via-hole diameter as measured by exposed portions of said selected shape via-hole recession deposited metal.

7. The method of constructing a ground plane-inclusive radio frequency Monolithic Microwave Integrated Circuit on a wafer of semiconductor material of claim 1 wherein said step of covering said wafer backside surface and said exposed selected portions of said selected shape via-hole recession-deposited metal with ground plane-forming metallization comprises forming via-hole electroplating-accomplished electrical interconnections between front side and back side surfaces of said semiconductor material wafer.

8. The method of constructing a ground plane-inclusive radio frequency Monolithic Microwave Integrated Circuit on a wafer of semiconductor material, said method comprising the steps of:

fabricating a plurality of circuit elements of said radio frequency Monolithic Microwave Integrated Circuit, including transistor component elements, on a front side surface of said wafer of semiconductor material;

said fabricating including forming, by a first dry chemical reactant anisotropic etching step, via-hole recessions of selected shape and selected depth into said semiconductor wafer front side surface;

metallizing said front side circuit elements of said radio frequency Monolithic Microwave Integrated Circuit including said transistor component elements;

said metallizing step also including wafer front side depositing of metal at said selected depth in said selected shape via-hole recessions;

etching, from a backside surface of said wafer, remaining depth portions of each said via-hole recession into said semiconductor wafer;

said step of etching, from a backside surface of said wafer comprising a second dry chemical reactant anisotropic etching step and said second dry chemical reactant anisotropic etching step being succeeded by a wet chemical reactant isotropic etching step;

terminating said etching in response to said backside etching exposing selected portions of said selected shape via-hole recession deposited metal; and covering said wafer backside surface and said exposed selected portions of said selected shape via-hole recession-deposited metal with ground plane-forming metallization.

9. The method of fabricating a ground plane-inclusive radio frequency integrated circuit on a wafer of semiconductor material, said method comprising the steps of:

forming metallized circuit elements and selected shape metal-covered via-hole recessions having salient arm portions of graduated arm lengths each comparable with a selected finished diameter of via-holes in said semiconductor wafer at a component-carrying front surface of said semiconductor wafer; and etching through remainder thickness portions of said semiconductor wafer in via-hole recession locations thereof during a back surface accessing of said wafer, said etching through step continuing until a selected portion of said selected shape via-hole recession metal becomes visible from said back surface accessing.

10. The method of fabricating a ground plane-inclusive radio frequency integrated circuit on a wafer of semiconductor material of claim 9 wherein said step of forming metallized circuit elements and selected shape metal-covered via-hole recessions at a component-carrying front surface of said semiconductor wafer includes a single metallization step.

11. The method of fabricating a ground plane-inclusive radio frequency integrated circuit on a wafer of semiconductor material of claim 9 wherein said step of etching through remainder thickness portions of said semiconductor wafer in via-hole recession locations thereof during a back surface accessing of said wafer includes both measuring an etched via-hole diameter and verifying lateral registration of said back surface etching with said front surface via-hole recessions.

12. The method of fabricating a ground plane-inclusive radio frequency integrated circuit on a wafer of semiconductor material, said method comprising the steps of:

forming metallized circuit elements and selected shape metal-covered via-hole recessions having salient arm portions of graduated arm lengths each comparable with a selected finished diameter of via-holes in said semiconductor wafer at a component-carrying front surface of said semiconductor wafer;

etching through remainder thickness portions of said semiconductor wafer in via-hole recession locations thereof during a back surface accessing of said wafer, said etching through step continuing until a selected portion of said selected shape via-hole recession metal becomes visible from said back surface accessing;

measuring a diameter dimension for a plurality of said etched via-holes using said via-hole recessions having salient arm portions of graduated arm lengths as a measuring scale; and correlating a plurality of said measured diameters with thickness variations in said wafer of semiconductor material.

13. The method of precisely controlling the diameter of an etched via-hole in an integrated circuit substrate, said method comprising the steps of:

disposing a graduated dimension metallic pattern having salient arm portions of graduated arm lengths each comparable with a selected finished diameter of via-holes in said semiconductor wafer over a closed end surface of a partially etched-through front side recess portion of a via-hole in said substrate;

completing etching of said substrate via-hole using back side accessed etching down to said graduated dimension pattern; and continuing said back side accessed etching until said via-hole is sufficiently enlarged in diameter to expose a selected portion of said graduated dimension pattern.

14. The method of precisely controlling the diameter of an etched via-hole in an integrated circuit substrate of claim 13 wherein said step of forming said front side recess with a graduated dimension pattern shape, comprises a photolithographic and etching sequence.

15. The method of accurately and consistently fabricating a radio frequency Monolithic Integrated Circuit on semiconductor material wafers, said method comprising the steps of:

constructing a plurality of circuit elements of said radio frequency Monolithic Integrated Circuit, including transistor component elements, on a front side surface of a wafer of semiconductor material;

said constructing including forming partial via-hole recessions having different plan view leg lengths in a specifically configured-shape measurement scale physical pattern, into said semiconductor wafer front side surface;

metallizing said front side circuit elements of said radio frequency Monolithic Integrated Circuit including said transistor component elements;

said metallizing step also including wafer front side depositing of metal at said selected depth in said via-hole recessions having different plan view leg lengths in said specifically configured-shape measurement scale physical pattern;

etching, from a backside surface of said wafer, remainder depth portions of each said via-hole recession into said semiconductor wafer; and terminating said etching step in response to said backside etching exposing selected portions of said via-hole recessions having different plan view leg lengths in said specifically configured-shape measurement scale physical pattern deposited metal.

16. The method of accurately and consistently fabricating front side to backside via holes in a semiconductor wafer-received radio frequency Monolithic Integrated Circuit, said method comprising the steps of:

constructing a plurality of circuit components of said radio frequency Monolithic Integrated Circuit on a front side surface of said semiconductor wafer;

said constructing step including forming patterns of selected arm-inclusive measurement grating-related shape, selected physical size and selected depth into said semiconductor wafer front side surface;

metallizing said front side circuit elements of said radio frequency Monolithic Integrated Circuit;

said metallizing step including wafer front side depositing of pattern metal at said selected depth in said selected measurement grating-related shape and selected physical size recessions in said semiconductor wafer;

etching, from a backside surface of said wafer, via-hole recessions in registration with said front side recessions of selected measurement grating-related shape, selected physical size and selected depth, into said semiconductor wafer; and terminating said etching step in response to said backside etching exposing selected portions of said front side deposited pattern metal.

17. The method of accurately and consistently fabricating front side to backside via holes in a semiconductor wafer-received radio frequency Monolithic Integrated Circuit of claim 16 further including the step of depositing a layer of backside metal, having electrical connection with said front side deposited pattern metal within said via-hole recessions, on said semiconductor wafer backside.

18. The method of accurately and consistently fabricating front side to backside via holes in a semiconductor wafer-received radio frequency Monolithic Integrated Circuit of claim 16 wherein said step of terminating said etching step in response to backside etching exposing selected portions of said front side deposited pattern metal includes gauging etching accomplished in said etching step with respect to etching exposed portions of said pattern metal having known physical shape and size characteristics.

19. The method of accurately and consistently fabricating front side to backside via holes in a semiconductor wafer-received radio frequency Monolithic Integrated Circuit of claim 16 wherein said step of terminating said etching step in response to backside etching exposing selected portions of said front side deposited pattern metal includes gauging etching accomplished in said etching step with respect to exposed portions of said pattern metal being free of etched material obstructions.

20. The method of accurately and consistently fabricating front side to backside via holes in a semiconductor wafer-received radio frequency Monolithic Integrated Circuit of claim 16 wherein said forming recessions of selected measurement related shape, selected physical size and selected depth in said semiconductor wafer front side surface in said constructing step comprises forming recessions determnining ensuing shape of said pattern metal in said semiconductor wafer.

21. The method of accurately and consistently fabricating front side to backside via holes in a semiconductor wafer-received radio frequency Monolithic Integrated Circuit of claim 16 wherein said step of metallizing said front side circuit elements of said radio frequency Monolithic Integrated Circuit includes depositing multiple layers of metal over said wafer front side.

22. The method of accurately and consistently fabricating front side to backside via holes in a semiconductor wafer-received radio frequency Monolithic Integrated Circuit of claim 16 wherein said metallizing step front side depositing of pattern metal at said selected depth in said selected measurement related shape and selected physical size recessions in said semiconductor wafer comprises a part of a wafer transistor metallizing sequence.

* * * * *